United States Patent
Hu et al.

(10) Patent No.: US 11,257,927 B2
(45) Date of Patent: Feb. 22, 2022

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yang Hu, Shanghai (CN); Jun Wang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 43 days.

(21) Appl. No.: 16/818,196

(22) Filed: Mar. 13, 2020

(65) Prior Publication Data

US 2020/0295158 A1 Sep. 17, 2020

(30) Foreign Application Priority Data

Mar. 15, 2019 (CN) .......................... 201910196224.7

(51) Int. Cl.
*H01L 29/66* (2006.01)
*H01L 29/08* (2006.01)
*H01L 21/02* (2006.01)

(52) U.S. Cl.
CPC .... *H01L 29/66575* (2013.01); *H01L 29/0847* (2013.01); *H01L 29/6653* (2013.01); *H01L 29/6656* (2013.01); *H01L 21/02532* (2013.01)

(58) Field of Classification Search
CPC .......... H01L 29/66575; H01L 29/6656; H01L 29/0847; H01L 29/6653; H01L 21/02532; H01L 29/4991; H01L 29/78; H01L 29/66636; H01L 29/66068
See application file for complete search history.

(56) References Cited

U.S. PATENT DOCUMENTS

| 9,892,961 | B1* | 2/2018 | Cheng ................ H01L 21/0217 |
| 2018/0166553 | A1* | 6/2018 | Lee ...................... H01L 29/4991 |
| 2019/0334008 | A1* | 10/2019 | Chen ................... H01L 29/6656 |

* cited by examiner

*Primary Examiner* — Karen Kusumakar
*Assistant Examiner* — Adam S Bowen
(74) *Attorney, Agent, or Firm* — Anova Law Group, PLLC

(57) ABSTRACT

A semiconductor structure and forming method are provided. The method includes providing a substrate, forming a gate structure over the substrate, forming a first spacer on a sidewall of the gate structure; forming an epitaxial layer on both sides of the gate structure and the first spacer, a surface of the epitaxial layer is higher than a surface of the substrate; forming a dielectric layer on the epitaxial layer and on surface of the first spacer, the dielectric layer is formed on both sides of the gate structure; after forming the dielectric layer, removing the first spacer to form a first opening between the epitaxial layer and the gate structure and between the dielectric layer and the gate structure, and in the first opening forming a second spacer that has a gap between the epitaxial layer and the gate structure.

20 Claims, 6 Drawing Sheets

SEMICONDUCTOR STRUCTURE AND FORMING METHOD THEREOF

CROSS-REFERENCES TO RELATED APPLICATION

This application claims the priority of Chinese Patent Application No. 201910196224.7, filed on Mar. 15, 2019, the content of which is incorporated by reference in its entirety.

TECHNICAL FIELD

The present disclosure generally relates to the field of semiconductor technology and, more particularly, to a semiconductor structure and a method of forming the semiconductor structure.

BACKGROUND

In the field of semiconductor technology, integrated circuits have evolved from a small number of interconnected devices to millions of devices fabricated on a single silicon chip. Modern integrated circuits have much better performance and complexity than originally envisioned. In order to achieve improvements in complexity and circuit density (number of devices that can be packaged onto a given chip area), feature size (also known as geometric size) of the smallest device also becomes increasingly smaller with each generation of integrated circuits. Nevertheless, it is very challenging to increase the number of devices that can be fabricated onto a single wafer by reducing the size of individual devices of an integrated circuit.

Complementary metal-oxide-semiconductor (CMOS) transistors are basic units in modern logic circuits, including P-type metal oxide semiconductors (PMOS) and N-type metal oxide semiconductor (NMOS) transistors. Due to the reduction of technology nodes and the increase of circuit complexity, transistors with better performance are needed to achieve various functions.

However, the performance of modern transistors still needs to be improved.

SUMMARY

One aspect of present disclosure provides a method of forming a semiconductor structure. In the method, a gate structure is formed over a substrate and a first spacer is formed on a sidewall of the gate structure. An epitaxial layer is formed in the substrate on both sides of the first spacer, and the epitaxial layer has a surface higher than a surface of the substrate. A dielectric layer is formed on the epitaxial layer and the substrate. The dielectric layer is formed on both sides of the gate structure. After forming the dielectric layer, the first spacer is removed to form a first opening on the substrate. The first opening separates the gate structure from the epitaxial layer and the dielectric layer. A second spacer is formed to fill in the first opening. A gap is formed under the second spacer and, between the epitaxial layer and the gate structure.

Another aspect of the present disclosure provides a semiconductor structure. The semiconductor structure includes a substrate, a gate structure and a dielectric layer, formed over the substrate and separated by a first opening. An epitaxial layer is formed in the substrate and extended into the dielectric layer above the substrate. The first opening is between a sidewall of the epitaxial layer and the gate structure. A spacer is filled in the first opening. A gap is formed under the spacer and, between the epitaxial layer and the gate structure Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
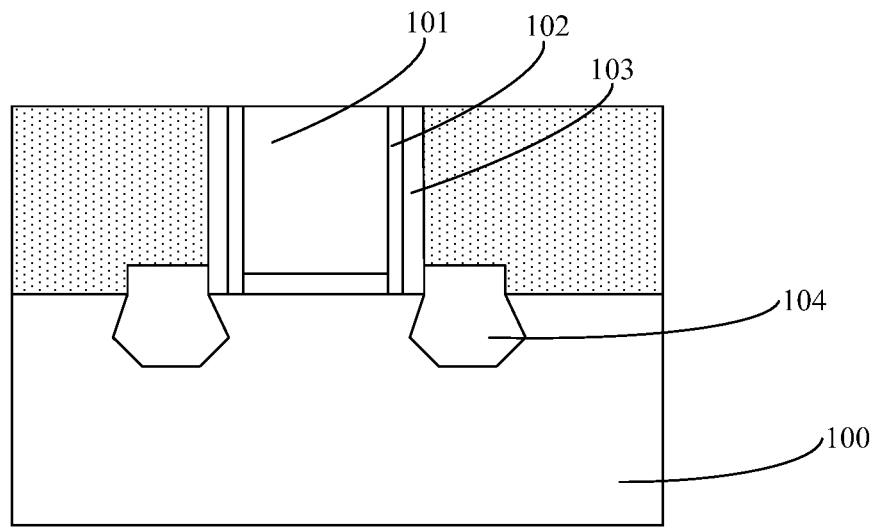
FIG. 1 is a schematic cross-sectional view of an embodiment of a semiconductor structure.

FIG. 1 is a schematic cross-sectional view of an embodiment of a semiconductor structure. Referring to FIG. 1, a substrate 100 is provided; a gate structure 101 is formed on the substrate 100; a spacer structure is formed on a sidewall of the gate structure 101, and the spacer structure includes a first spacer 102 and a second spacer 103 located on a sidewall of the first spacer 102; an epitaxial layer 104 is formed inside the substrate on both sides of the gate structure 101 and the spacer structure.

The first spacer 102 is composed of materials including silicon oxide, and the second spacer 103 is composed of materials including silicon nitride. The spacer structure is composed of a combination of silicon oxide and silicon nitride and can protect the gate structure from etching damage in the fabrication process, reducing risks of leakage between the gate and source/drain areas.

In one embodiment, in order to achieve a better protection for the gate by using the spacer structure, the material of the first spacer is dense silicon oxide with a dielectric constant of approximately 4; the material of the second spacer is dense silicon nitride with a dielectric constant of approximately 8; the spacer structure composed of the first spacer and the second spacer has a relatively large dielectric constant, which affects capacitance between the gate structure and the epitaxial layer. A large dielectric constant of the spacer structure enables a large capacitance between the gate structure and the epitaxial layer, and the large capacitance enables high power consumption of a transistor, which further slows response of the transistor and reduces performance of the transistor.

In order to solve the aforementioned problems, the present disclosure provides a method for forming a semiconductor structure, including forming an opening in a substrate by removing a second spacer, and forming a third spacer with a gap in the opening. The third spacer has a reduced dielectric constant. Because of the reduced dielectric constant of the third spacer, the spacer structure has a reduced overall dielectric constant, thus capacitance between the gate structure and the epitaxial layer is reduced, leading to a transistor with reduced power consumption, increased response, and improved performance.

To better clarify the aforementioned objects, features, and advantages of the present disclosure, some embodiments combined with figures are given below to elaborate on the present disclosure.

Figure 8:
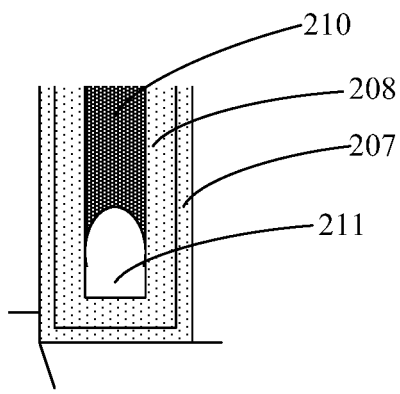
Figure 9:
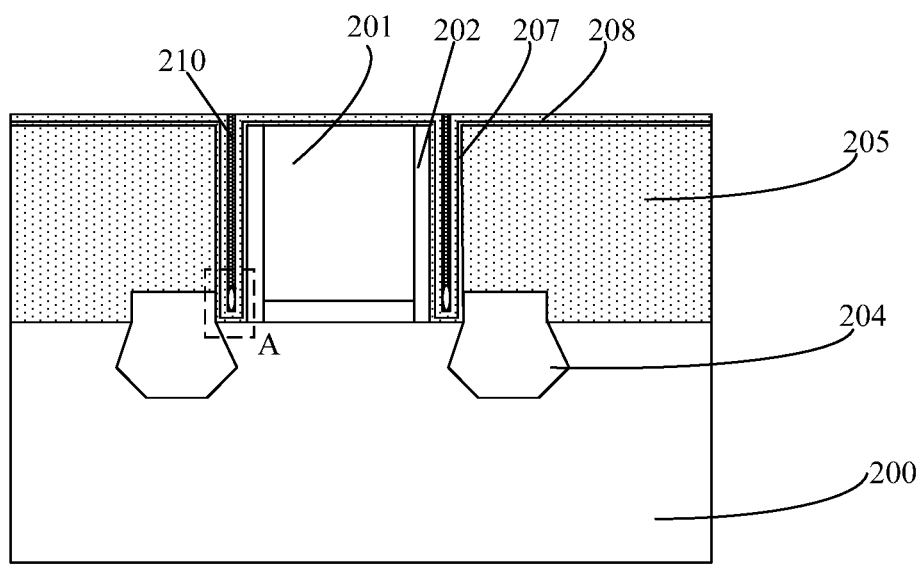
Figure 10:
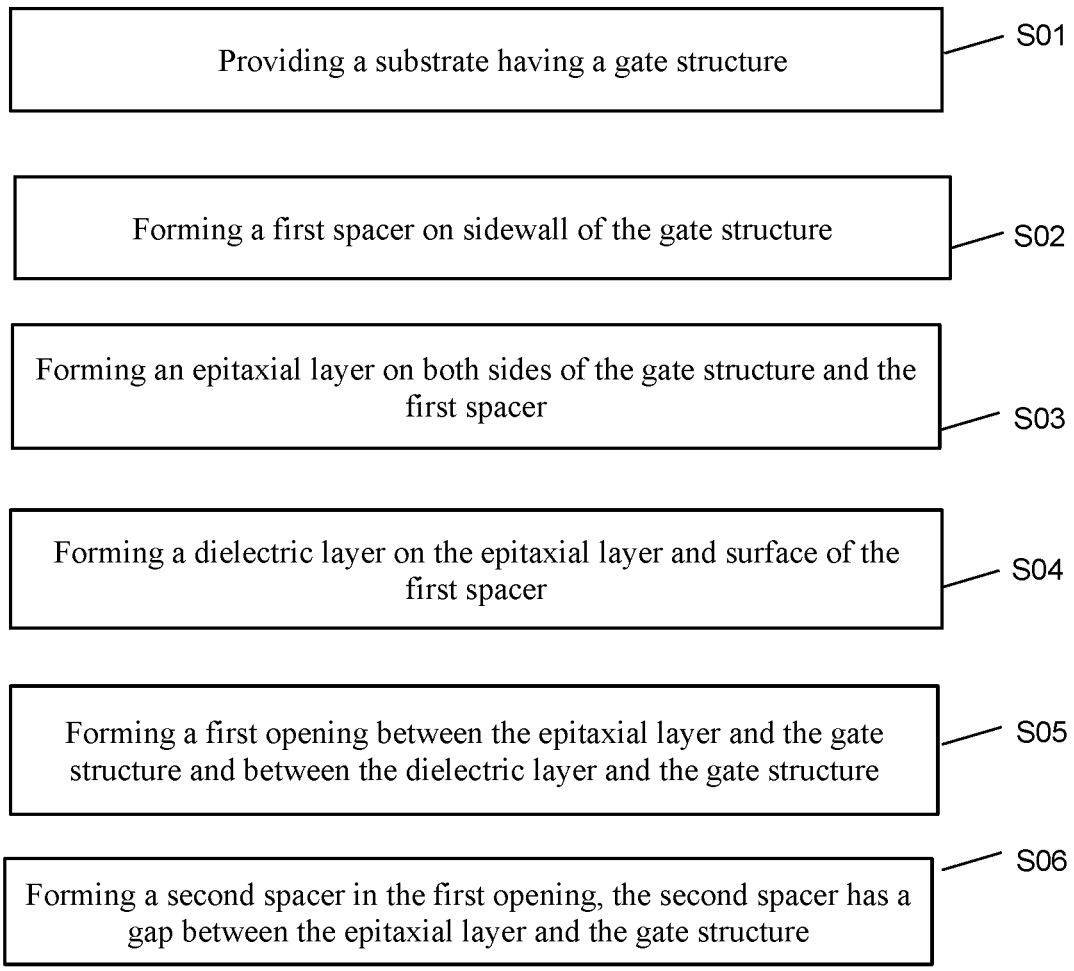
FIG. 10 illustrates an exemplary formation process of a semiconductor structure consistent with various disclosed embodiments of the present disclosure.

FIG. 10 illustrates a flowchart of an exemplary method for fabricating a semiconductor structure consistent with various disclosed embodiments in the present disclosure. FIGS. 2-9 illustrate schematic views of forming a semiconductor structure at certain stages of an exemplary fabrication process.

Figure 2:
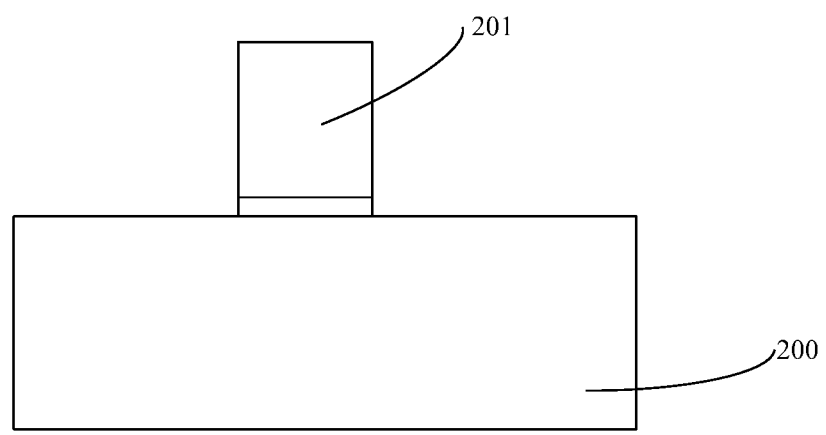
FIGS. 2-9 illustrate structures corresponding to certain stages during an exemplary formation process of a semiconductor structure consistent with various disclosed embodiments of the present disclosure.

Referring to FIG. 10, at the beginning of the fabrication process, a substrate is provided and a gate structure is formed on the substrate (S01). FIG. 2 shows a schematic cross-section view of a corresponding semiconductor structure.

Referring to FIG. 2, a substrate 200 is provided. A gate structure 201 is formed on the substrate 200. The gate structure includes a gate dielectric layer (not labeled) and a gate layer (not labeled) on the gate dielectric layer.

In one embodiment, the substrate 200 is a silicon substrate. In other embodiments, the substrate 200 includes a silicon germanium substrate, a silicon carbide substrate, a silicon-on-insulator substrate, a germanium-on-insulator substrate, a glass substrate, or a III-V compound substrate such as gallium nitride substrate or gallium arsenide substrate.

Figure 3:
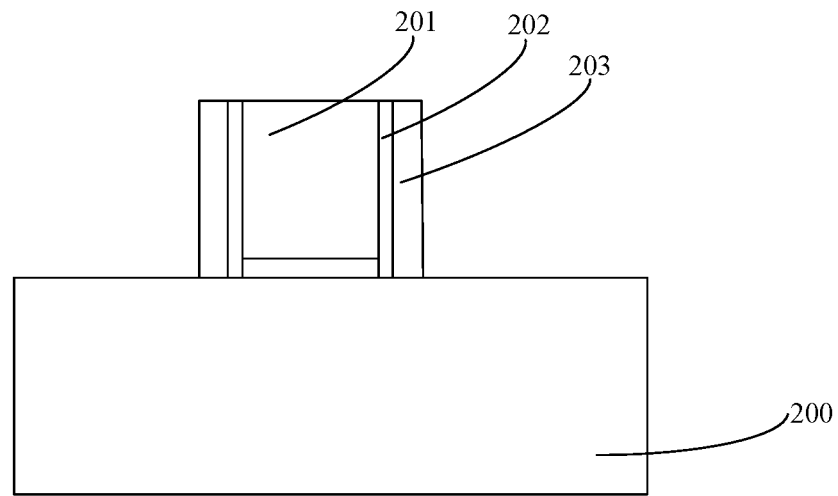

Further, returning to FIG. 10, a first spacer may be formed on a sidewall of the gate structure (S02). FIG. 3 shows a schematic cross-section view of a corresponding semiconductor structure.

Referring to FIG. 3, a third spacer 202 and a first spacer 203 are formed on the sidewall of the gate structure 201, and the third spacer 202 is located between the first spacer 203 and the gate structure 201.

The method for forming the third spacer 202 includes forming a third spacing-material layer (not shown) on the substrate 200 and the gate structure 201, etching back the third spacing-material layer until exposing the surface of the substrate 200, and forming the third spacer 202 on the sidewall of the gate structure 201.

In one embodiment, the forming of the third spacing-material layer includes a deposition process; the third spacer 202 is composed of materials including silicon oxide.

The forming of the first spacer 203 includes forming a first spacing-material layer (not shown) on the substrate 200 and the gate structure 201, and the first spacing material layer covers the third spacer 202; etching back the first spacing-material layer and forming the first spacer 203 on the sidewall of the gate structure 201 and the third spacer 202.

In one embodiment, the forming of the first spacing-material layer includes a deposition process; the first spacer 203 is composed of materials including silicon nitride.

Figure 4:
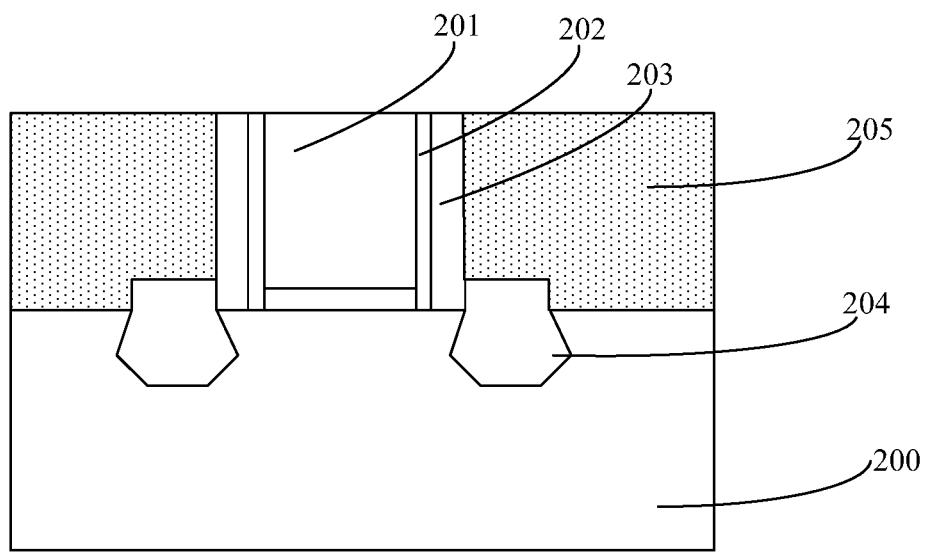

Further, returning to FIG. 10, an epitaxial layer may be formed on both sides of the gate structure and the first spacer (S03). FIG. 4 shows a schematic view of a corresponding semiconductor structure.

Referring to FIG. 4, an epitaxial layer 204 is formed in the substrate 200 on both sides of the gate structure 201 and the first spacer 203. A surface of the epitaxial layer 204 is higher than a surface of the substrate 200.

The forming of the epitaxial layer 204 includes: using the gate structure 201, the third spacer 203, and the first spacer 203 as a mask to form grooves (not shown) in the substrate 200 on both sides of the gate structure 201 and first spacer 203, and epitaxially growing the epitaxial layer 204 in the grooves.

In one embodiment, materials of the epitaxial layer 204 include carbon silicon or silicon germanium.

Figure 5:
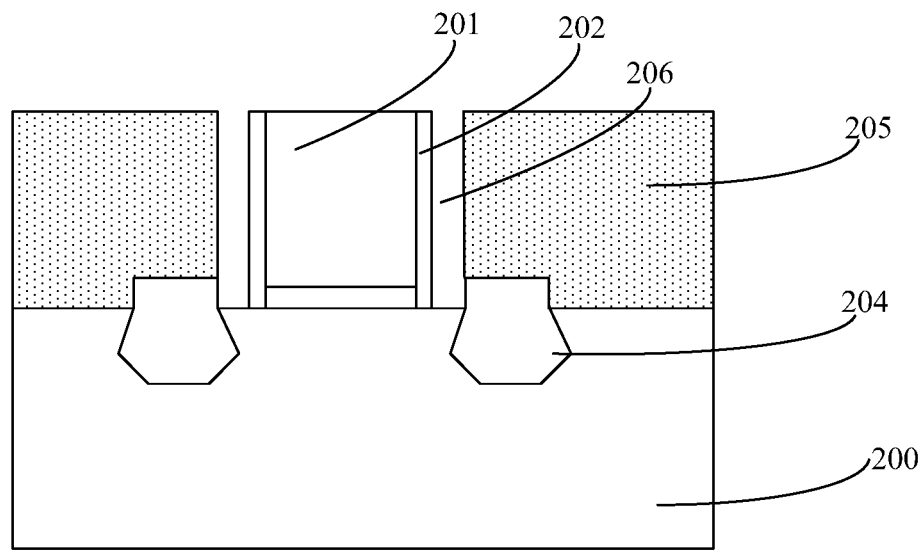

Further, returning to FIG. 10, a dielectric layer may be formed on the epitaxial layer and on surface of the first spacer (S04), and a first opening may be formed between the epitaxial layer and the gate structure and between the dielectric layer and the gate structure (S05). FIG. 5 shows a schematic view of a corresponding semiconductor structure.

After forming the epitaxial layer 204, a dielectric layer 205 is formed on the substrate 200. The dielectric layer 205 is located on the epitaxial layer 204 and on surface of the first spacer 203. The dielectric layer 205 is formed on both sides of the gate structure 201, and a top of the gate structure 201 is exposed.

In one embodiment, the forming of the dielectric layers 205 includes a deposition process; materials of the dielectric layer 205 include silicon oxide.

Referring to FIG. 5, after the formation of the dielectric layer 205, the first spacer 203 is removed, and a first opening 206 is formed between the epitaxial layer 204 and the gate structure 201, and between the dielectric layer 205 and the gate structure 201.

The removing of the first spacer 203 includes an anisotropic dry etching process.

In one embodiment, gas selected for the dry etching process is a mixed gas of fluorocarbon-based gas and oxygen. The mixed gas of fluorocarbon-based gas and oxygen has a high etching selectivity to silicon nitride. Therefore, when the first spacer 203 is removed, the third spacer 202 and the dielectric layer 205 will not be damaged.

After the formation of the first opening 206, a protective layer is formed inside the first opening 206. The protective layer includes a first protective layer and a second protective layer. The first protective layer has a thickness smaller than that of the second protective layer. A total thickness of the first protective layer and the second protective layer is smaller than a thickness of the first spacer 203.

The total thickness of the first protective layer and the second protective layer is smaller than the thickness of the first spacer 203, so that a second opening having a depth/width ratio larger than 3:1 can be formed in the second protective layer. When a second spacer is formed in the second opening, a gap can be formed between the gate structure 201 and the epitaxial layer 204, thereby reducing the dielectric constant of the second spacer and decreasing the capacitance between the gate structure 201 and the epitaxial layer 204, thereby improving performances of a transistor. If the total thickness of the first protective layer and the second protective layer is greater than or equal to the thickness of the first spacer 203, the gap cannot be formed between the gate structure 201 and the epitaxial layer 204, so that the capacitance between the gate structure 201 and the epitaxial layer 204 cannot be reduced, and performances of a transistor cannot be improved.

Figure 6:
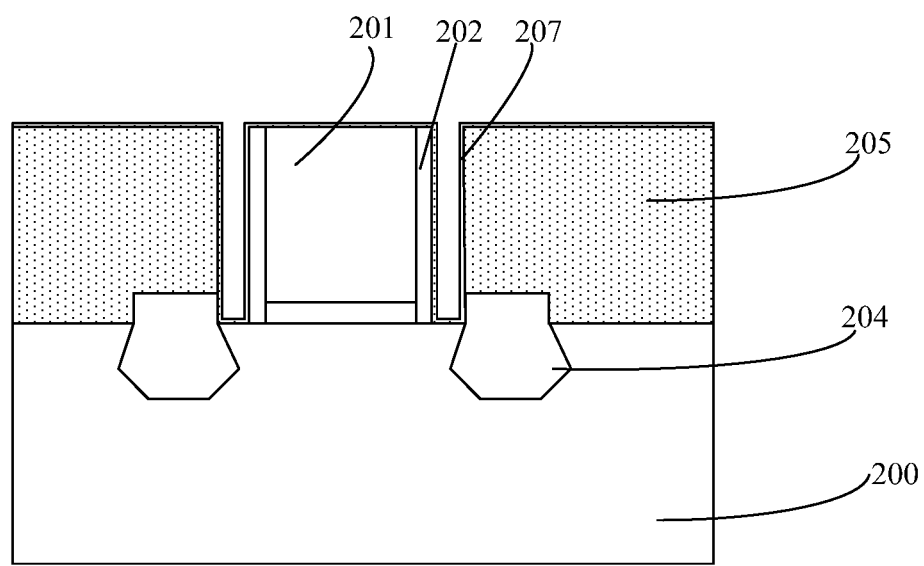

Referring to FIG. 6, a first protective layer 207 is formed in the first opening 206.

In one embodiment, the forming of the first protective layer 207 includes a wet chemical growth process, a solution used for the wet chemical growth includes ozone-containing deionized water, and materials of the first protective layer 207 includes silicon oxide.

The significance of using the wet chemical growth process to form the first protective layer 207 on an inner wall of the first opening 206 is that the ozone-containing deionized water can oxidize the surface of the substrate exposed by the first opening 206 to form a thin layer of silicon oxide for protecting the exposed substrate surface, thereby avoiding damaging the substrate surface in case of directly using a vapor deposition process. Using the vapor deposition, a thick layer of silicon oxide will be formed, and the substrate surface will be damaged by reactive gases, which further affects the performances of devices.

A thickness of the first protective layer 207 is smaller than that of the second protective layer. The forming of the first protective layer 207 includes a slow wet chemical growth process that has a slow rate of silicon oxide growth. If a thick second protective layer is subsequently formed by using the slow wet chemical growth process, production efficiencies will be reduced, and production costs will be increased. Therefore, a thin first protective layer of silicon oxide is wet-grown in the first opening 206 to protect the substrate, while a thick second protective layer of silicon oxide is formed by a chemical vapor deposition process with a high deposition rate to improve production efficiencies.

Figure 7:
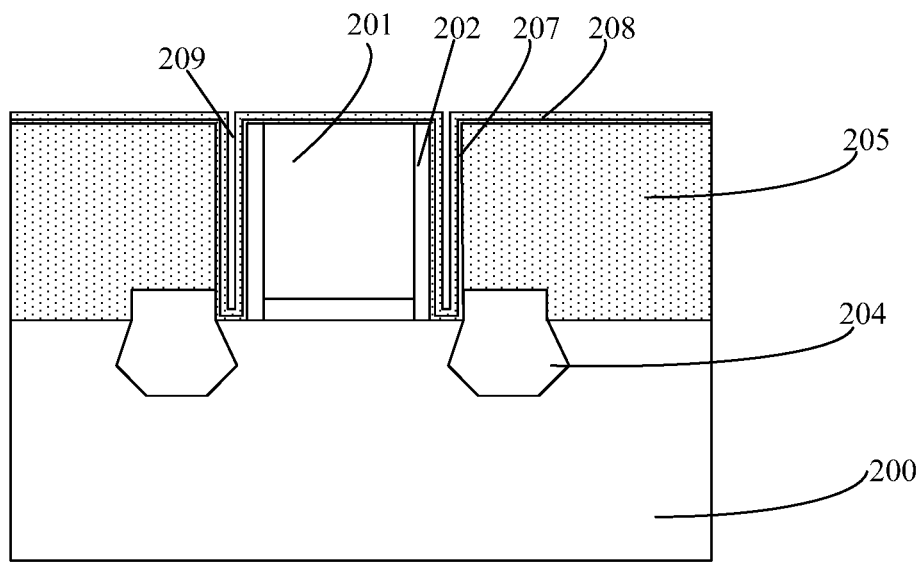

Referring to FIG. 7, a second protective layer 208 is formed on the first protective layer 207, and the second protective layer 208 has a second opening 209 therein.

In one embodiment, the forming of the second protective layer 208 includes a chemical vapor deposition process. Materials of the second protective layer 208 include silicon oxide.

In one embodiment, the second opening 209 has a depth/width ratio greater than 3:1.

The depth/width ratio of the second opening 209 is greater than 3:1, the significance is: when the depth/width ratio of the second opening 209 is less than 3:1, a gap will not be easily formed between the gate structure 201 and the epitaxial layer 204 after subsequently filling the second opening 209 with a second spacer material, so that dielectric constant of the second spacer cannot be reduced, thereby capacitance between the gate structure 201 and the epitaxial layer 204 cannot be reduced, hence performances of a transistor cannot be improved.

Further, returning to FIG. 10, a second spacer may be formed in the first opening and the second spacer has a gap between the epitaxial layer and the gate structure (S06). FIGS. 8-9 show a schematic views of a corresponding semiconductor structure.

Referring to FIG. 8 and FIG. 9. FIG. 8 is an enlarged schematic view of area A based on the structure shown in FIG. 9. A second spacer 210 is formed in the second opening 209, and the second spacer has a gap 211 between the epitaxial layer 204 and the gate structure 201.

The forming of the second spacer 210 includes: forming a second spacer material layer (not shown) in the second opening 209 and the surface of the substrate 200; and planarizing the second spacer material layer to form the second spacer 210.

In one embodiment, materials of the second spacer material layer include silicon nitride.

In one embodiment, the forming of the second spacer material layer includes a chemical vapor deposition process or a physical vapor deposition process.

In one embodiment, since the second opening 209 has a depth/width ratio greater than 3:1, when a reaction gas is introduced into the second opening 209 to form the second spacer material layer, the second spacer material is deposited on upper portion of the second opening 209. The deposition of second spacer material increasingly narrows the upper portion of the second opening 209, so that less and less reactive gas enters the bottom, thus less and less second spacer material is deposited at the bottom until the upper portion of the second opening 209 is completely closed by the deposition of the second spacer material. This process leads to the formation of a gap 211 at a bottom of the second opening 209 between the gate structure 201 and the epitaxial layer 204, which reduces dielectric constant of the second spacer, decreases capacitance between the gate structure 201 and the epitaxial layer 204, lowers power consumption of a transistor, and improves performances of a transistor.

In one embodiment, the planarizing of the second spacer material layer includes a chemical mechanical polishing process.

One embodiment of the present disclosure also provides a semiconductor structure formed by the aforementioned method. Referring to FIG. 9, the semiconductor structure includes: a substrate 200; a gate structure 201 on the substrate 200; a dielectric layer 205 on the substrate 200 and the gate structure 201; an epitaxial layer 204 located in the substrate on both sides of the gate structure 201; a third spacer 202 located on a sidewall of the gate structure 201; a first protective layer 207 between the third spacer 202 and the dielectric layer 205; a second protective layer 208 on the first protective layer 207; and a second spacer 210 located inside the second protective layer 208, the second spacer has a gap 211 between the gate structure 201 and the epitaxial layer 204.

As disclosed, the technical solutions of the present disclosure have the following advantages: by removing the first spacer of the gate structure, the first opening is formed between the epitaxial layer and the gate structure, and between the dielectric layer and the gate structure; forming the second spacer with the gap in the first opening, such that dielectric constant of the second spacer is reduced, capacitance between the gate structure and the epitaxial layer is reduced, thereby lowering power consumptions of a transistor and improving performances of a transistor. The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method of forming a semiconductor structure, comprising:
   providing a substrate;
   forming a gate structure over the substrate;
   forming a first spacer on a sidewall of the gate structure;
   forming an epitaxial layer in the substrate on both sides of the first spacer, wherein the epitaxial layer has a surface higher than a surface of the substrate;
   forming a dielectric layer on the epitaxial layer and the substrate, and on both sides of the gate structure;
   after forming the epitaxial layer and the dielectric layer, removing the first spacer to form a first opening to expose a sidewall of a portion of the epitaxial layer above the surface of the substrate, wherein the first opening separates the gate structure from the epitaxial layer and the dielectric layer; and
   forming a second spacer to fill in the first opening, wherein a gap is formed under the second spacer and, between the epitaxial layer and the gate structure.

2. The method according to claim 1, wherein forming the second spacer includes:
   forming a protective layer on a bottom and sidewalls of the first opening, thereby forming a second opening defined by the protective layer in the first opening;

forming a second spacer material layer in the second opening and on the substrate; and planarizing the second spacer material layer to form the second spacer.

3. The method according to claim 2, wherein the second opening has an aspect ratio greater than 3.

4. The method according to claim 2, wherein forming the second spacer material layer includes a chemical vapor deposition process or a physical vapor deposition process.

5. The method according to claim 2, wherein the second spacer material layer is made of materials including silicon nitride.

6. The method according to claim 2, wherein:
the protective layer includes a first protective layer and a second protective layer; and
forming the protective layer includes:
   forming the first protective layer on the bottom and the sidewalls of the first opening; and
   forming the second protective layer on the first protective layer, wherein the second protective layer formed in the first opening defines the second opening.

7. The method according to claim 6, wherein forming the first protective layer includes a wet chemical growth process and forming the second protective layer includes a chemical vapor deposition process.

8. The method according to claim 6, wherein the first protective layer is made of a material including silicon oxide and the second protective layer is made of a material including silicon oxide.

9. The method according to claim 6, wherein the first protective layer has a thickness smaller than a thickness of the second protective layer; and a total thickness of the first protective layer and the second protective layer is smaller than a thickness of the first spacer.

10. The method according to claim 1, further including:
before forming the first spacer, forming a third spacer on the sidewall of the gate structure, followed by forming the first spacer on the third spacer such that the third spacer is formed between the gate structure and the first spacer, wherein the third spacer is separated from the epitaxial layer by the second spacer and gap that are formed in the first opening.

11. The method according to claim 10, wherein the third spacer is made of a material including silicon oxide.

12. The method according to claim 1, wherein the first spacer is made of a material including silicon nitride.

13. The method according to claim 1, wherein removing the first spacer includes a dry etching process.

14. The method according to claim 1, wherein the epitaxial layer is made of a material including silicon germanium and carbon silicon.

15. A semiconductor structure, comprising:
a substrate;
a gate structure and a dielectric layer, formed over the substrate and separated by a first opening;
an epitaxial layer, formed in the substrate and extended into the dielectric layer above the substrate, wherein the first opening is between a sidewall of the epitaxial layer and the gate structure and expose a sidewall of a portion of the epitaxial layer above a surface of the substrate; and
a spacer and a gap, formed in the first opening, wherein the gap is formed under the spacer and, between the epitaxial layer and the gate structure.

16. The structure according to claim 15, wherein the spacer is made of a material including silicon nitride.

17. The structure according to claim 15, further including:
a protective layer, formed on a bottom and sidewalls of the first opening to provide a second opening, wherein the spacer and the gap are formed in the second opening defined by the protective layer.

18. The structure according to claim 17, wherein the protective layer is made of a material including silicon oxide.

19. The structure according to claim 15, wherein the epitaxial layer is made of a material including silicon germanium and carbon silicon.

20. The method according to claim 6, wherein:
the gap is isolated from the portion of the epitaxial layer above the surface of the substrate and the substrate by the first protective layer and a second protective layer, and
the first protective layer has a thickness smaller than a thickness of the second protective layer.

* * * * *